United States Patent
Mann

(10) Patent No.: US 8,597,994 B2
(45) Date of Patent: Dec. 3, 2013

(54) SEMICONDUCTOR DEVICE AND METHOD OF FABRICATION

(75) Inventor: Randy W. Mann, Milton, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 133 days.

(21) Appl. No.: 13/113,901

(22) Filed: May 23, 2011

(65) Prior Publication Data

US 2012/0299106 A1  Nov. 29, 2012

(51) Int. Cl.
*H01L 21/8238* (2006.01)

(52) U.S. Cl.
USPC .................................. 438/213; 257/E21.442

(58) Field of Classification Search
USPC .................................. 438/213; 257/E21.442
See application file for complete search history.

(56) References Cited

U.S. PATENT DOCUMENTS

| | | | |
|---|---|---|---|
| 6,642,090 B1 | 11/2003 | Fried et al. | |
| 6,872,647 B1 | 3/2005 | Yu et al. | |
| 6,921,963 B2 | 7/2005 | Krivokapic et al. | |
| 6,924,560 B2 * | 8/2005 | Wang et al. | 257/67 |
| 7,495,285 B2 | 2/2009 | Lee | |
| 7,517,764 B2 | 4/2009 | Booth, Jr. et al. | |
| 7,611,938 B2 | 11/2009 | Cheng et al. | |
| 2004/0150029 A1 | 8/2004 | Lee | |
| 2004/0266077 A1 | 12/2004 | Yeo et al. | |
| 2005/0121676 A1 | 6/2005 | Fried et al. | |
| 2006/0091428 A1 | 5/2006 | Yeo et al. | |
| 2007/0075351 A1 | 4/2007 | Schulz et al. | |
| 2008/0050902 A1 | 2/2008 | John et al. | |
| 2008/0064149 A1 | 3/2008 | Cohen | |
| 2008/0265308 A1 | 10/2008 | Lee | |
| 2008/0296702 A1 | 12/2008 | Lee et al. | |
| 2009/0121288 A1 | 5/2009 | Patruno | |
| 2009/0278196 A1 | 11/2009 | Chang et al. | |
| 2010/0015768 A1 | 1/2010 | Jang et al. | |
| 2010/0015802 A1 | 1/2010 | Snyder et al. | |
| 2010/0075473 A1 | 3/2010 | Gibbons | |
| 2010/0127327 A1 | 5/2010 | Chidambarrao | |
| 2010/0144121 A1 | 6/2010 | Chang et al. | |
| 2010/0163971 A1 | 7/2010 | Hung et al. | |

OTHER PUBLICATIONS

Mann, R.W., "Interactions of Technology and Design in Nanoscale SRAM", Ph. D. Dissertation, Dec. 2010.
Mann, R.W. and Calhoun, B.H., "New Category of Ultra-Thin Notchless 6T SRAM Cell Layout Topologies for Sub-22nm", In Proc. 12th International Symposium on Quality Electronic Design, ISQED 2011.

\* cited by examiner

*Primary Examiner* — Chandra Chaudhari

(74) *Attorney, Agent, or Firm* — Ingrassia Fisher & Lorenz, P.C.

(57) ABSTRACT

A semiconductor device is provided that includes a first inverter having a first p-channel FinFET and a first n-channel FinFET each coupled to a first shared contact forming a first cell node and having a first common gate. A second inverter is included having a second p-channel FinFET and a second n-channel FINFET each coupled to a second shared contact forming a second cell node and having a second common gate aligned with the first shared contact of the first inverter forming a latch circuit. Additionally, a pair of FinFET passgates are included each having a drain contact respectively coupled the first and second cell nodes and a source contact connected to one of a complementary bit line. Finally, a word line is connected to a gate contact of each of the pair of FinFET passgates to provide a static random access memory cell.

17 Claims, 14 Drawing Sheets

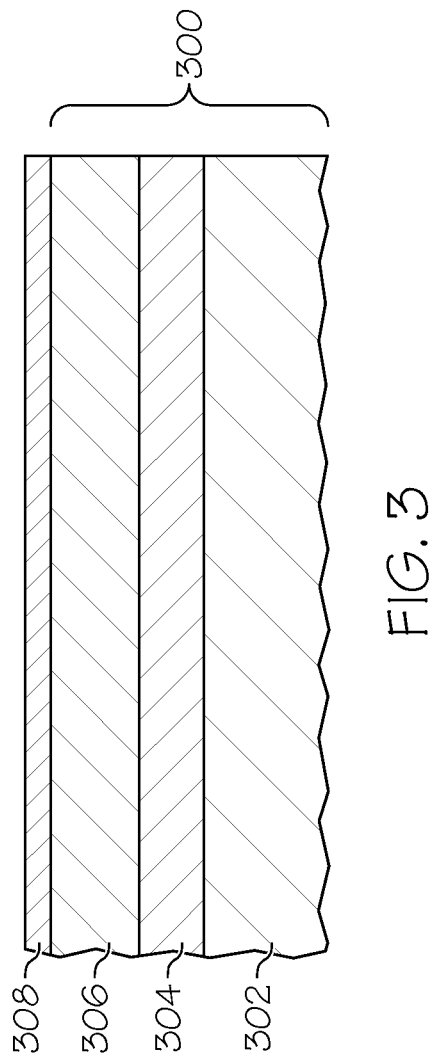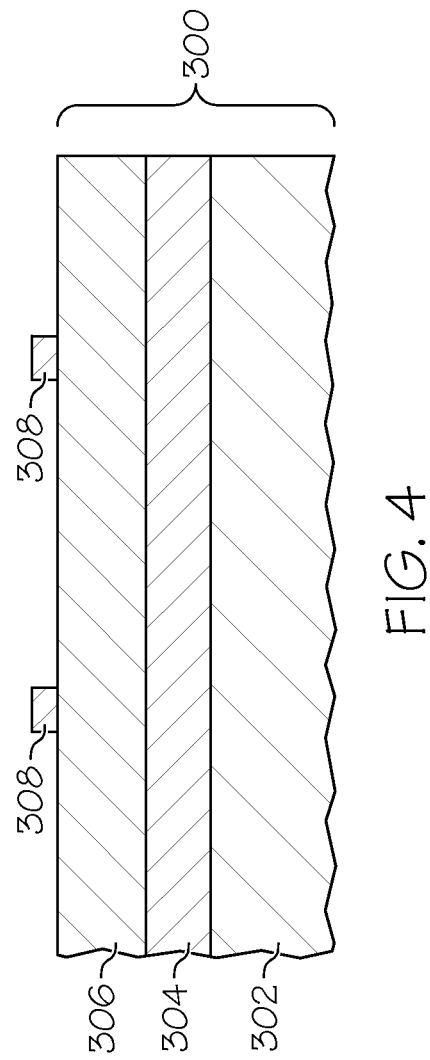

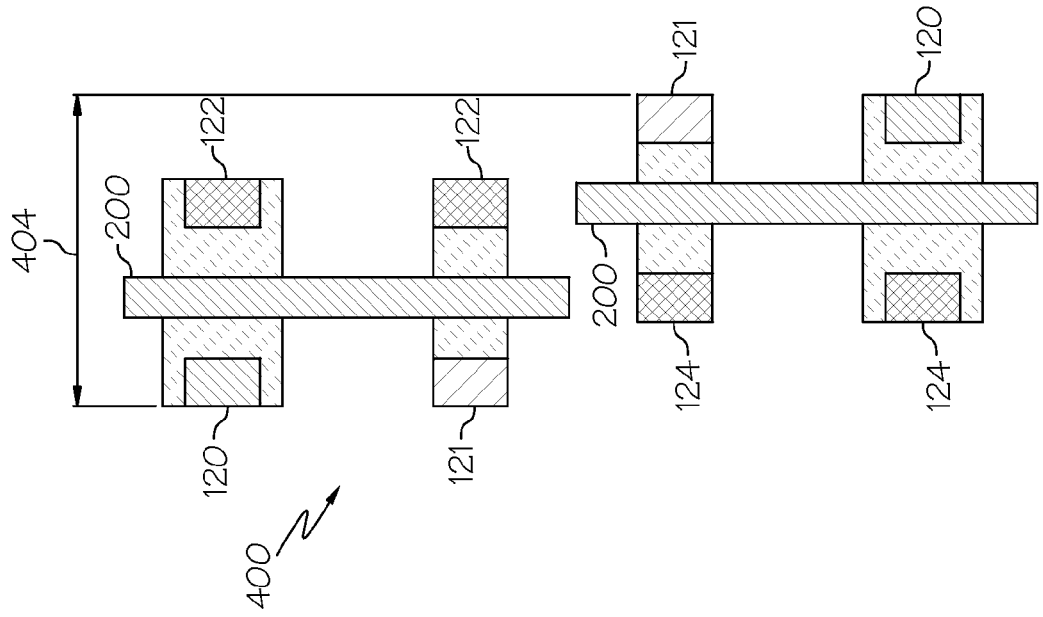
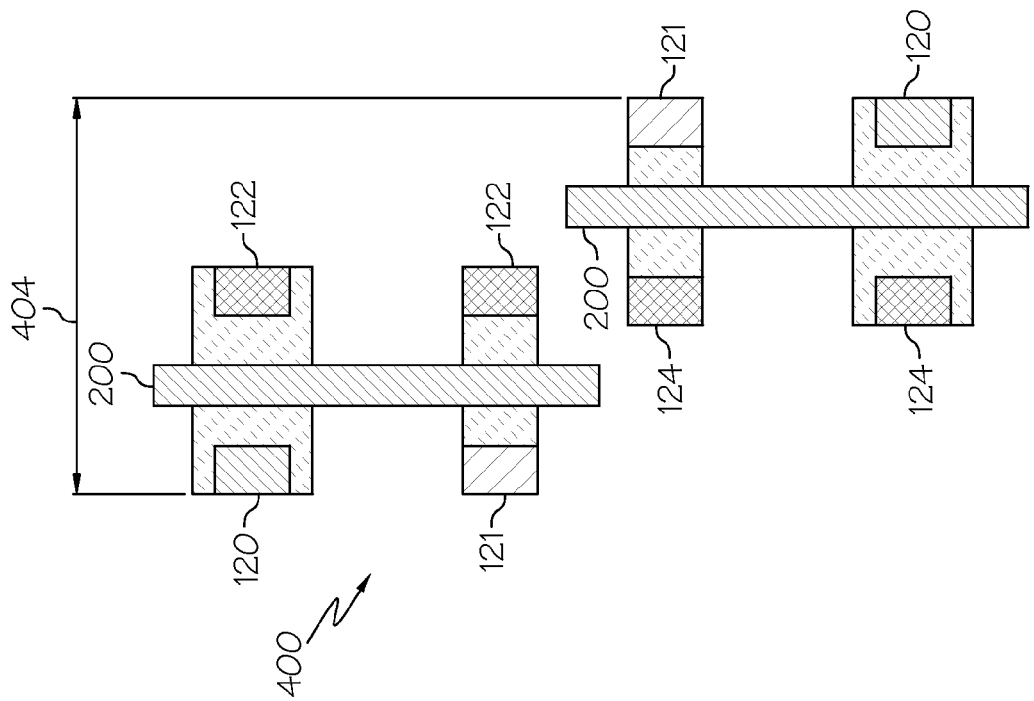
FIG. 7A (PRIOR ART)
FIG. 7B

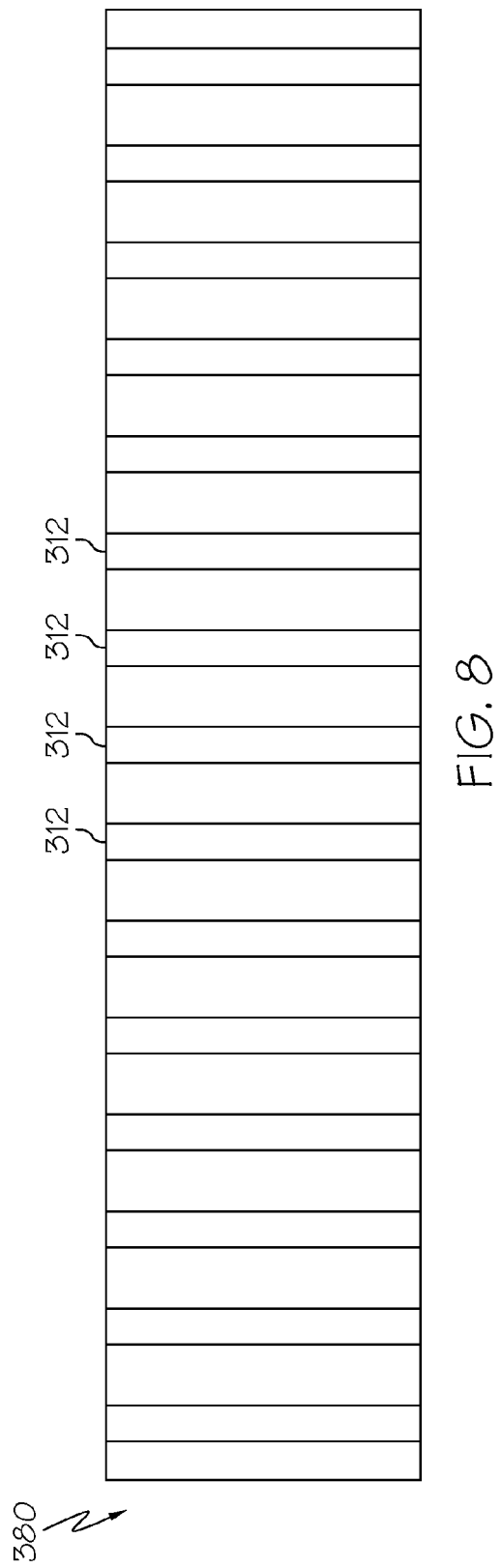
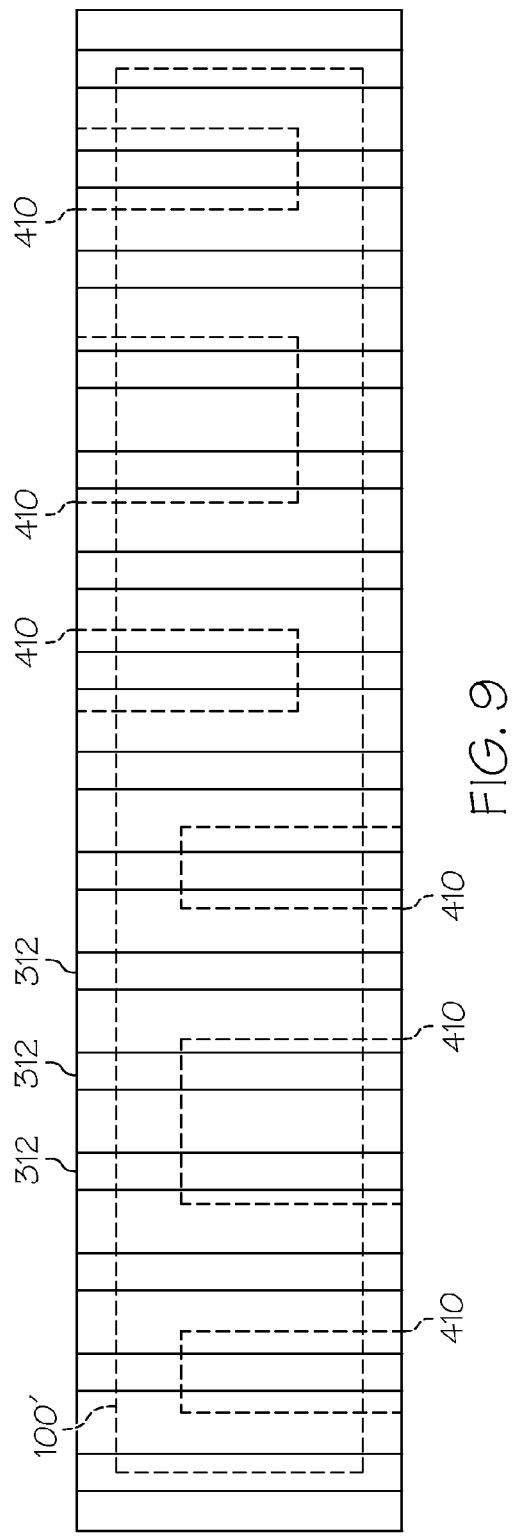
FIG. 8
FIG. 9

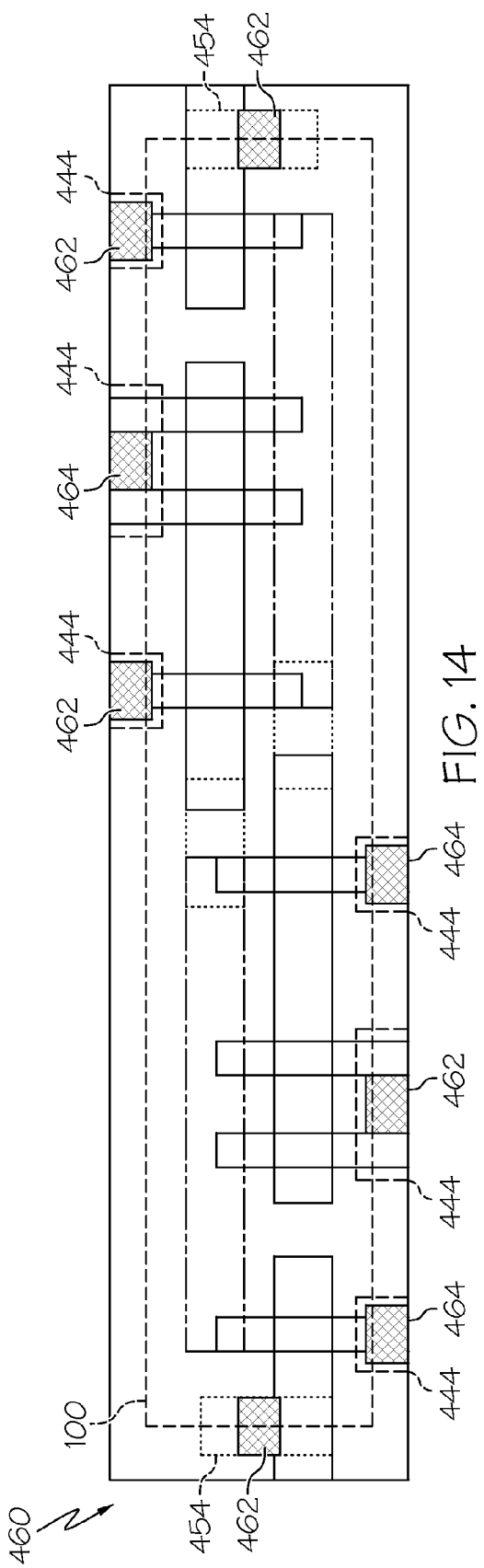
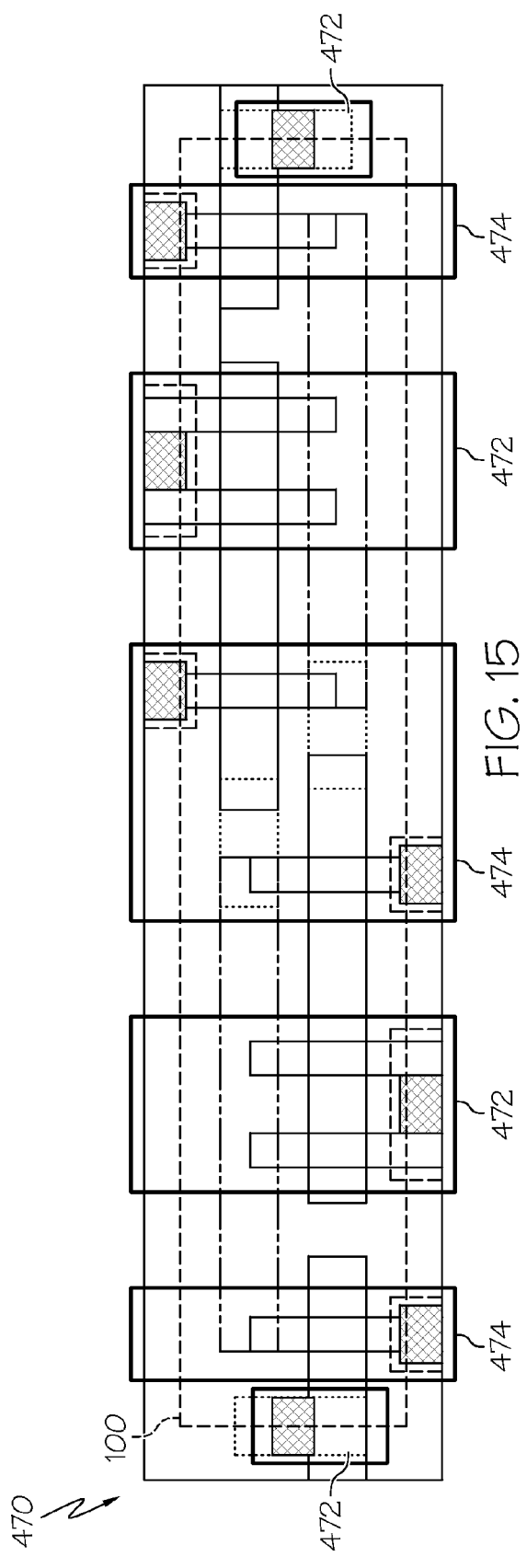

SEMICONDUCTOR DEVICE AND METHOD OF FABRICATION

TECHNICAL FIELD

The technical field relates to semiconductor devices and to methods for their fabrication, and more particularly, relates to static random access memory (SRAM) devices employing FinFETs and to methods for their fabrication.

BACKGROUND

The majority of present day integrated circuits (ICs) are implemented by using a plurality of interconnected field effect transistors (FETs). A FET includes a gate electrode as a control electrode and spaced apart source and drain regions formed in a semiconductor substrate and between which a current can flow. A control voltage applied to the gate electrode controls the flow of current through a channel between the source and drain regions. Depending upon doping during the fabrication processes a FET can be an n-channel device (NFET) or a p-channel device (PFET).

A FinFET is a type of FET that can be fabricated using very small scale processes. A FinFET is named for its use of one or more conductive fins extending between a source region and a drain region of the FinFET. A FinFET also includes a gate structure that is wrapped around the fin, with the dimensions of fin (as wrapped by gate structure) determining the effective channel of FinFET.

One of the most important semiconductor devices is the static random access memory (SRAM) cell used in many demanding memory applications. A six-transistor (6T) SRAM cell includes two PFETs for a pull-up operation, two NFETs for pull-down, and two NFETs for input/output (i.e., passgate or transfer) access. However, conventional layouts (topologies) for a 6T SRAM cell typically have jogs or notches (e.g., right angles or corners in the mask—which become patterned into the on-wafer structures) that can lead to pull-down device mismatch given the alignment challenges of sub-22 nm geometries. Also, the shared contact of the inverters is printed orthogonal to the gate necessitating lithography (printing) in two directions which can cause reduced control of critical dimensions.

Accordingly, a need exists to provide methods for fabricating an integrated circuit forming an SRAM cell that facilitates fabrication at sub-22 nm geometries. Additionally it is desirable to provide SRAM cells using FinFETs that can more fully take advantage of jogless, uni-directional SRAM processes. Furthermore, other desirable features and characteristics of the present invention will become apparent from the subsequent detailed description and the appended claims, taken in conjunction with the accompanying drawings and the foregoing technical field and background.

BRIEF SUMMARY

In accordance with one embodiment a method for fabricating a semiconductor device is provided that forms a semiconductor device by forming a first inverter having a first p-channel FinFET and a first n-channel FinFET each coupled to a first shared contact forming a first cell node and having a first common gate. Additionally, a second inverter is formed and cross-coupled to the first inverter. The second inverter is formed with a second p-channel FinFET and a second n-channel FinFET each coupled to a second shared contact forming a second cell node and having a second common gate aligned with the first shared contact of the first inverter.

In accordance with a further embodiment, a method for fabricating a semiconductor device is provided that forms a static random access memory cell by forming a first inverter having a first p-channel FinFET and a first n-channel FinFET each coupled to a first shared contact forming a first cell node and having a first common gate. Additionally, a second inverter is formed and cross-coupled to the first inverter. The second inverter is formed with a second p-channel FinFET and a second n-channel FinFET each coupled to a second shared contact forming a second cell node and having a second common gate aligned with the first shared contact of the first inverter. Next, a pair of FinFET passgates is formed each having a drain contact respectively coupled the first and second cell nodes and having a source contact coupled to one of a complementary bit line pair. Finally, a word line connects to a gate contact of the pair of FinFET passgates to provide a static random access memory cell.

In accordance with yet another embodiment, a semiconductor device is provided that includes a first inverter having a first p-channel FinFET and a first n-channel FinFET each coupled to a first shared contact forming a first cell node and having a first common gate. A second inverter is included having a second p-channel FinFET and a second n-channel FINFET each coupled to a second shared contact forming a second cell node and having a second common gate aligned with the first shared contact of the first inverter forming a latch circuit. Additionally, a pair of FinFET passgates are included each having a drain contact respectively coupled the first and second cell nodes and a source contact connected to one of a complementary bit line pair. Finally, a word line is connected to a gate contact of each of the pair of FinFET passgates to provide a static random access memory cell.

BRIEF DESCRIPTION OF THE DRAWINGS

The present disclosure will hereinafter be described in conjunction with the following drawing figures, wherein like numerals denote like elements, and wherein

FIGS. 3-6 are cross sectional views that illustrate a finned semiconductor device structure and a related fabrication method suitable for forming FinFETs for use by embodiments of the present disclosure;

FIGS. 7A-7B are partial layout views illustrating the topology of the conventional inverters of FIG. 2 and an inverter according to exemplary embodiments of the present disclosure;

FIGS. 8-16 are layout views illustrating techniques and technologies that can be utilized to form (fabricate) FinFET semiconductor devices for the SRAM cell of FIG. 1 from the fined substrate formed in conjunction with FIGS. 3-13;

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

For the sake of brevity, conventional techniques related to semiconductor device fabrication may not be described in detail herein. Moreover, the various tasks and process steps described herein may be incorporated into a more comprehensive procedure or process having additional steps or functionality not described in detail herein. In particular, various steps in the manufacture of semiconductor transistor devices are well known and so, in the interest of brevity, many conventional steps will only be mentioned briefly herein or will be omitted entirely without providing the well known process details.

Figure 1:
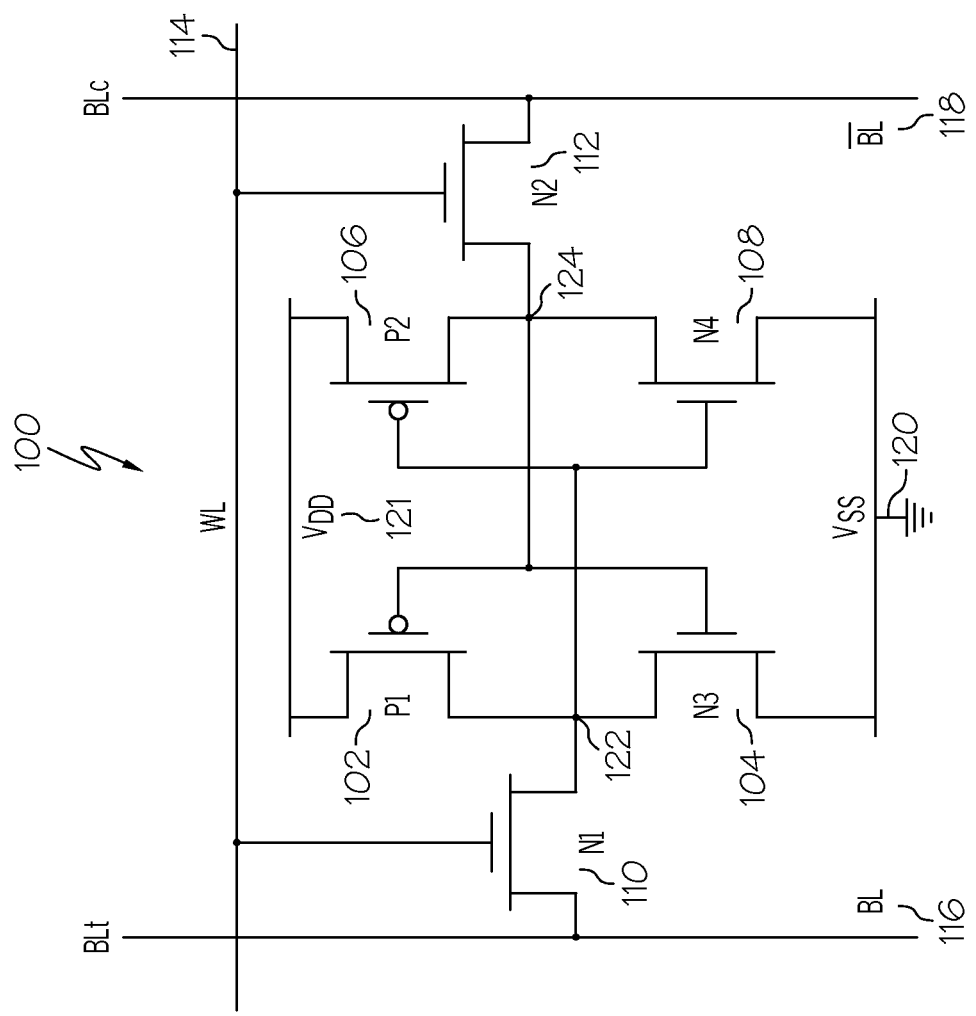
FIG. 1 is a schematic diagram of a 6T SRAM cell.

A common 6T SRAM cell 100 schematic diagram is shown in FIG. 1. Generally, an SRAM cell is made up of a latch circuit (as the memory portion) and an access circuit for writing information (a bit) into the latch or reading information from the latch. The latch is formed by PFET 1 (102) and NFET 3 (104), which form an inverter that is cross-coupled with another inverter formed by PFET 2 (106) and NFET 4 (108). NFET 1 (110) and NFET 2 (112) are the passgate (access) devices that control reading from and writing into the SRAM cell 100. As illustrated in FIG. 1, the passgates 110 and 112 are coupled at either a source or drain contact to the inverters at a shared contact point (122 and 124 respectively) that form cell nodes of the SRAM cell 100. In exemplary embodiments, each of the FETs of the SRAM cell 100 are formed of FinFETS. To form an SRAM array, multiple (often hundreds of millions) SRAM cells 100 are arranged in rows and columns with the cells of the same row sharing one word line (WL) 114 (which connects to a gate contact of all the passgates), while cells of the same column share the same complementary bit line (BL) pair of BLt (116) and BLc (the logical compliment of BLt) 118 (which connects to the opposite of the source or drain contact of each passgate coupled to the shared contact point).

During standby, the WL 114 is at logic low (i.e., VSS or ground 120) and the bit lines (116 and 118) are biased to a logic high level. The passgate devices NFET 1 (110) and NFET 2 (112) are shut off because the WL is biased to VSS (logical low). A logical 1 is maintained in the SRAM cell 100 with PFET 1 (102) and NFET 4 (108) ON (i.e., conducting) and PFET 2 (106) and NFET 3 (104) being in an OFF state. This causes cell node 122 to be at logic high (i.e., VDD) while cell node 124 is at logic low (i.e., ground). Conversely, a logical 0 is maintained in the SRAM cell 100 when PFET 2 (106) and NFET 3 (104) are ON, and PFET 1 (102) and NFET 4 (108) are OFF, which forces the cell node 124 to logic high and the cell node 122 to logic low.

During a read operation, either BLt (116) or BLc (118) is pulled down from its pre-charged logic high level upon activation of the selected word line 114, which causes the NFET passgates (110 and 112) to conduct. BLt is pulled down if the cell is at logical 0, whereas BLc is pulled down if the cell is at logical 1. The voltage differential between BLt and BLc is generated by the state of the cell being read and is amplified by sense amplifiers. The sense amplifiers detect this small voltage difference between BLt and BLc, and generate the digital (1's or 0's) signals for external circuitry requesting the memory read operation. Also, either a logic 1 or logic 0 can be stored in (or written to) the SRAM cell 100 during a write operation. To write a logic 1, the WL is driven high, BLt 116 is driven to high and BLc 118 to low. Pass gate 112 (N2) passes the logical 0 onto node (124) which shuts OFF NFET 3 (104) and turns on PFET (102) so that a 1 is stored on node (122). Conversely, to write a 0, BLt 116 is forced to low and BLc 118 to high.

Figure 2A:
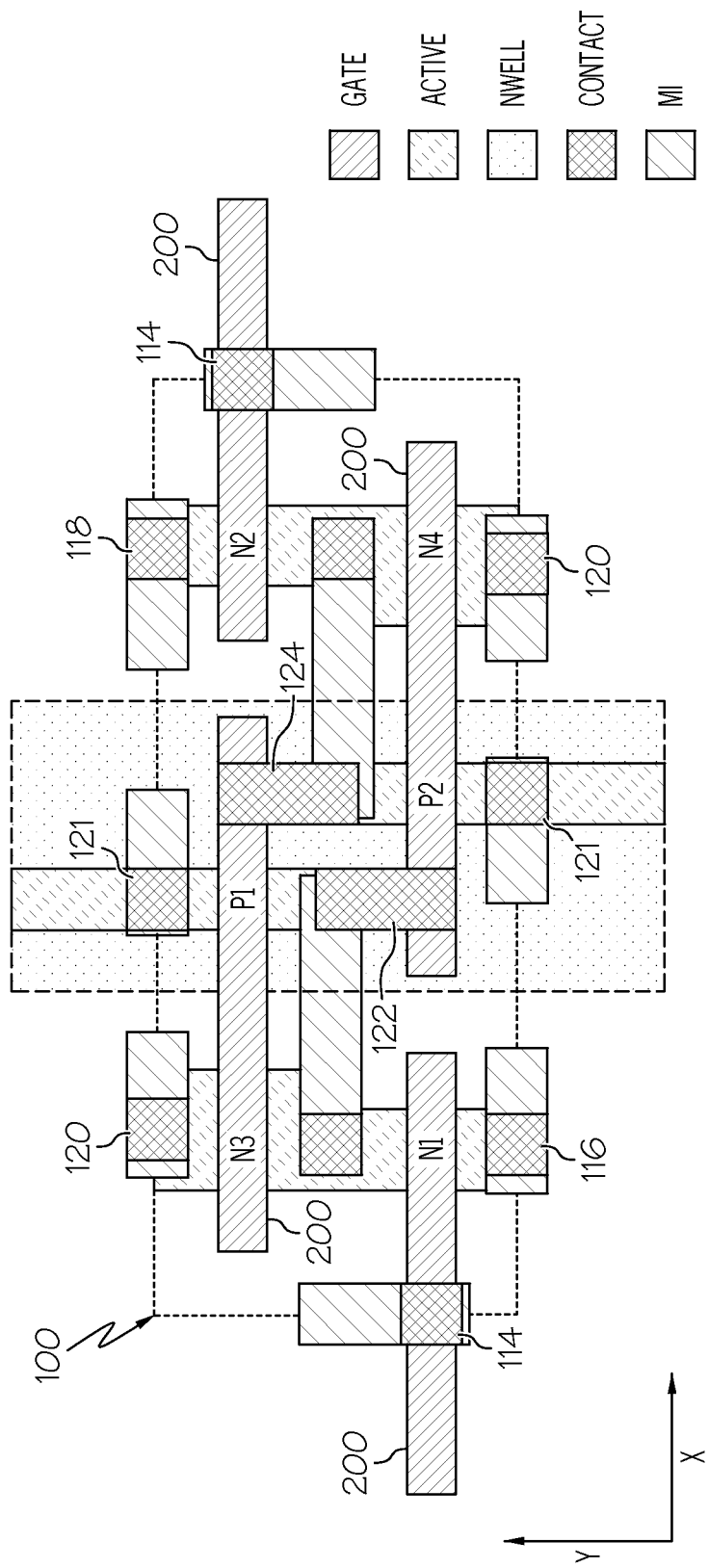
FIGS. 2A-2C are layout views illustrating a conventional topology for the 6T SRAM cell of FIG. 1.

Referring to FIG. 2A, a conventional layout (topology) for the SRAM cell 100 is shown. To facilitate understanding, like reference numerals for the schematic layout of FIG. 1 are provided. The topology illustrated in FIG. 2A has arguably been the preferred industry layout for SRAM cells for 65 nm (and below) geometries. However, at sub-22 nm geometries, the limitations and inherent weaknesses of the conventional layout of FIG. 2A may significantly impact the ultimate yield and functionality. Note that the gates 200 of the FETS are printed in one direction (see x axis reference), while the shared contacts forming the cell nodes of the inverters (122 and 124) are printed orthogonally (see y axis reference) to the gates 200. The complex orthogonal metallization pattern creates challenges in the sub-22 nm geometries which are solved with the unidirectional process of the present disclosure (discussed in more detail below).

Figure 2B:
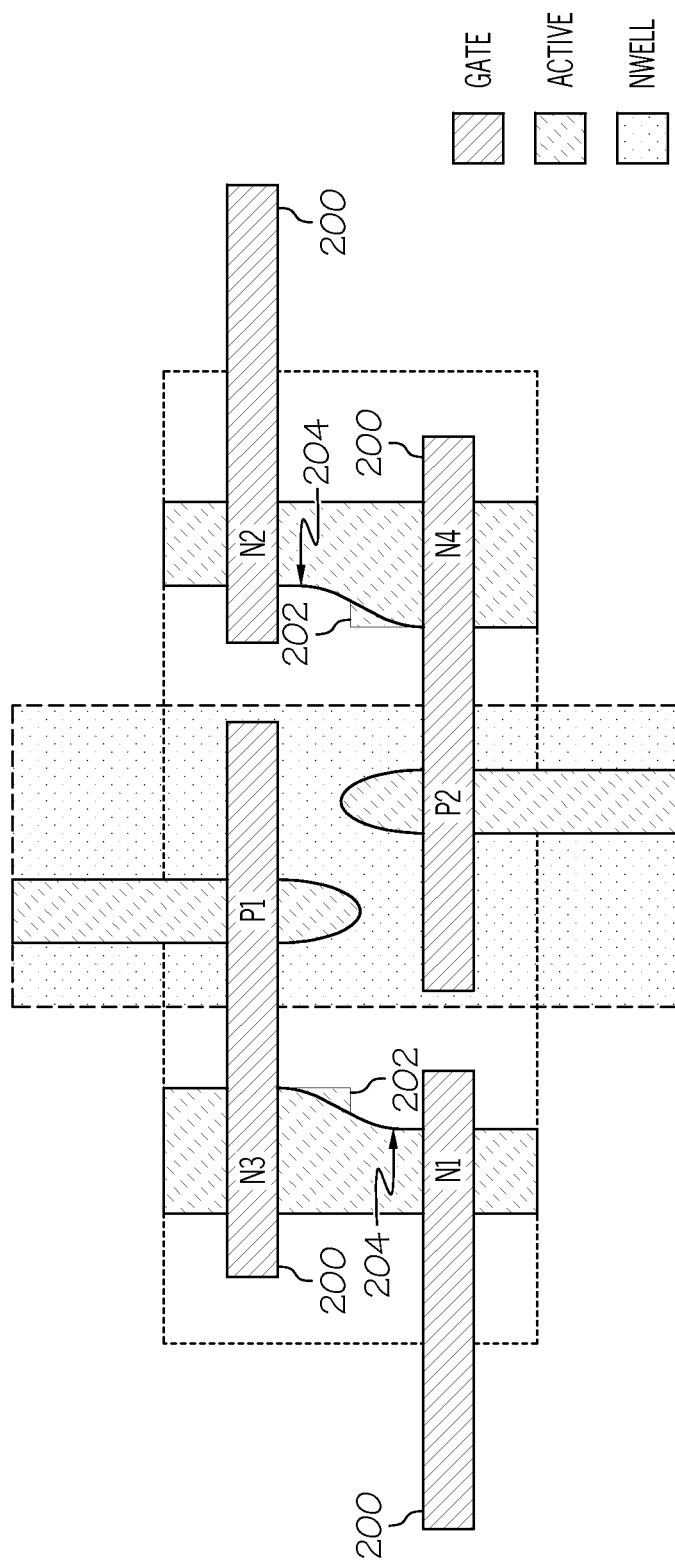
Figure 2C:
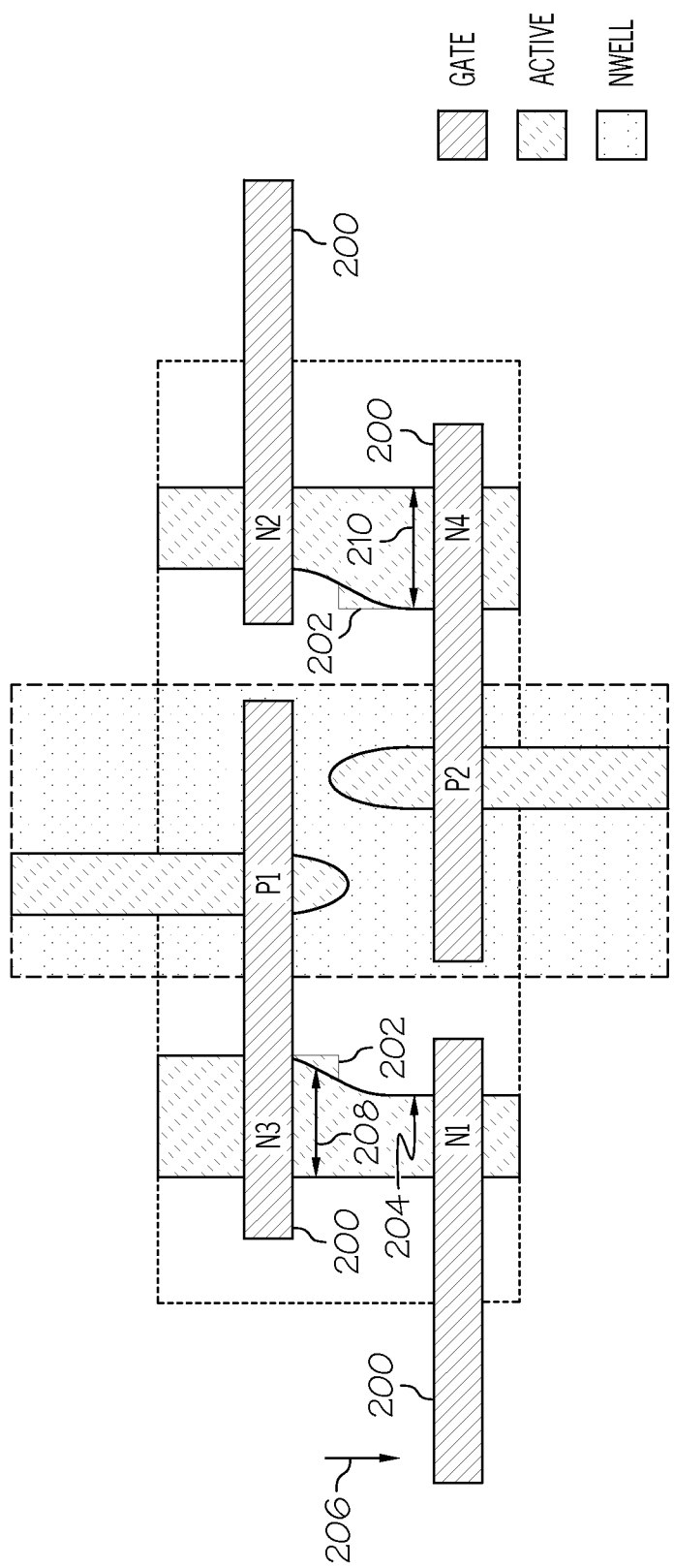

In FIG. 2B, the conventional topology is also see to include jogs 202 (e.g., right angles or corners in the active areas) that are subject to significant rounding 204 in the sub-22 nm geometries. To make matters worse, FIG. 2C illustrates the consequences of misalignment (vector 206) compounding the rounding issues and resulting in NFET 3 have a size 208 that is mismatched to the size 210 of NFET 4. These issues are also resolved by the jogless (no corners or right angles) and iso-dimensional (meaning that all lines are the same size) process used by the present disclosure (discussed in more detail below).

As noted above, in the exemplary embodiments of the present disclosure, the FETs of the SRAM cell 100 are formed as FinFETs. Accordingly, FIGS. 3-6 are cross sectional views that illustrate an embodiment of the techniques and technologies that can be utilized to form (fabricate) fin structures for FinFET semiconductor devices. FIG. 3 begins illustrating an embodiment of the fabrication process and depicts a portion of a substrate 300, which is preferably formed from wafer 302 that underlies buried insulator 304 that underlies semiconductor layer 306. Therefore, for example, substrate 300 may comprise a single crystal silicon-on-insulator (SOI) wafer.

Buried insulator 304 may be formed on wafer 302 using a high dose oxygen implant followed by a high temperature anneal or a thermal oxidation followed by a silicon bonding process, or other techniques known in the art. Buried insulator 304 may comprise any insulative material, such as Buried Oxide (sometimes referred to as the BOX layer). However, any type and/or combination of buried insulators may be used for buried insulator 304. (Finfet devices may also be built without the BOX—in this case the fin is connected to the substrate and is surrounded by a deposited oxide or insulating material.)

Semiconductor layer 306 may be formed on buried insulator 304 by any technique known in the art, and may comprise any conductive material. For the exemplary purposes of this disclosure, semiconductor layer 206 comprises a single crystal silicon-on-insulator (SOI) layer. Semiconductor layer 206 may have any thickness, and as will become apparent, the thickness of semiconductor layer 306 will define the thickness (i.e., height) of the fins.

Referring still to FIG. 3, an exemplary method to form one or more fins from semiconductor layer 206 begins with depositing a hard mask film. Hard mask film 208 acts as an etch stop layer and will be used throughout the FinFET fabrication process when needed. For the exemplary purposes of this disclosure, hard mask film 208 may be silicon dioxide or silicon nitride. Next, the hard mask 308 is patterned and etched by any technique known in the art. For example, a suitable thin layer of photoresist may be used to cover the surface of hard mask film 308. Next, a mask with a predetermined orientation may be used to generate a specific pattern of narrow lines on the photoresist overlying hard mask film 308.

Once the narrow lines on the photoresist overlying hard mask film 308 are generated, then a suitable directional etch may be performed through hard mask film 308 to form narrow lines in hard mask film 308, which typically have a width in the range of approximately 0.3 nm to 40 nm. As will be made clear, the width of hard mask film 208 narrow lines translates into the width of the fins. The photoresist is then stripped away by a suitable chemical process, thereby resulting in hard mask film 308 narrow lines on semiconductor layer 306 as depicted in FIG. 4.

Figure 5:
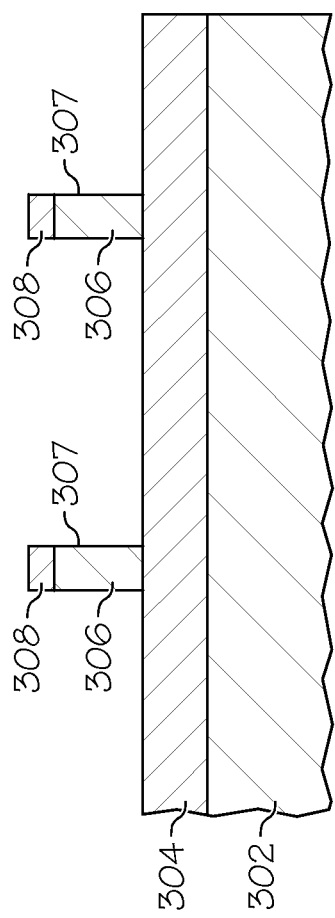

The next step is to anisotropically etch semiconductor layer 306 using hard mask film 308 narrow lines, thereby forming the fins. This may be done using a suitable reactive ion etch process that etches semiconductor layer 306, stopping on buried insulator 304. Thus, as depicted in FIG. 5, fins remain and comprise portions of semiconductor layer 306 with overlying hard mask film 308 narrow lines. The fins may have opposing vertical sidewalls 307 that are substantially perpendicular to buried insulator 304. The predetermined orientation of the mask in a previous step has resulted in sidewalls 307 being oriented on particular crystal planes in order to optimize carrier mobility for both carrier types and/or reduce mobility in specific devices as needed, thereby maintaining an acceptable and/or desired performance. The fins may then be doped or left undoped as defined by the specific technology needs. This may include an ion implantation into the fins so as to set the threshold voltage or may be intrinsic.

Figure 6:
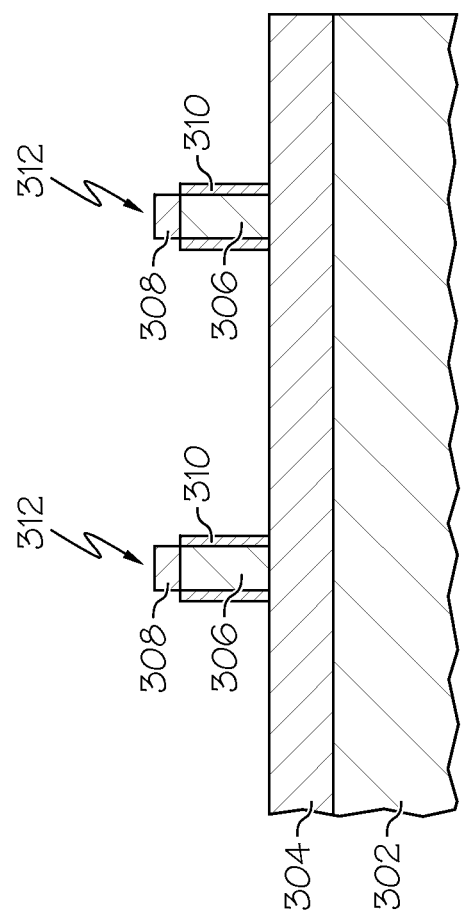

The next step is to form gate stacks. Accordingly, gate insulator layers 310 are formed on opposing vertical sidewalls 307 and opposing end walls of the fins (i.e., semiconductor layer 306 portions) as depicted in FIGS. 6. Gate insulator layers 310 may be formed by thermal oxidation or alternatively, may be formed by depositing a dielectric film as known in the art resulting in the formation of the fins 312.

Following the formation of the fins 312, any number of known process steps can be performed to complete the fabrication of the FET semiconductor devices that form the SRAM cell 100 (FIG. 1). As described below, the preferred manufacturing process can be carried out using a unidirectional (printing in one direction) process with jogless (no corners or right angles in the) active area masks and having iso-dimensional (same size lines) structures to complete the fabrication of FinFETs for the SRAM cell 100 (FIG. 1). These final process steps, and other back end process steps, are described below in conjunction with FIGS. 6-16.

Referring now to FIGS. 7A-7B, a layout view illustrates the topology of the conventional layout 400 (see also FIG. 2) for the SRAM cell 100 (FIG. 7A) and the topology 402 according to exemplary embodiments of the present disclosure (FIG. 7B). As can be seen, the fundamental difference in the layouts of FIGS. 7A and 7B is that the shared contacts (which form the cell nodes 122 and 124) are linearly arranged in the conventional layout 400, while the layout 402 shifts the gates 200 of the inverters to be aligned with the shared contacts of the other inverter. This has the advantage of reducing cell size (compare 404 to 406) in the bit line direction. Accordingly, bit line capacitance is reduced, which improves overall cell performance.

As noted above, in the exemplary embodiments of the present disclosure, the FETs of the SRAM cell 100 are formed as FinFETs. Accordingly, FIGS. 8-16 are layout views that illustrate an embodiment of the techniques and technologies that can be utilized to form (fabricate) FinFET semiconductor devices for the SRAM cell 100 from the fined substrate formed in conjunction with FIGS. 3-6 above. As noted above, for the sake of brevity, conventional techniques related to semiconductor device fabrication may not be described in detail herein. For example, the formation of dielectric insulating layers between the contact layers for the avoidance of shorts, except when a connection is desired, is not described. Moreover, the various tasks and process steps described herein may be incorporated into a more comprehensive procedure or process having additional steps or functionality not described in detail herein. In particular, various steps in the manufacture of semiconductor transistor devices are well known and so, in the interest of brevity, many conventional steps will only be mentioned briefly herein or will be omitted entirely without providing the well known process details.

Figure 10:
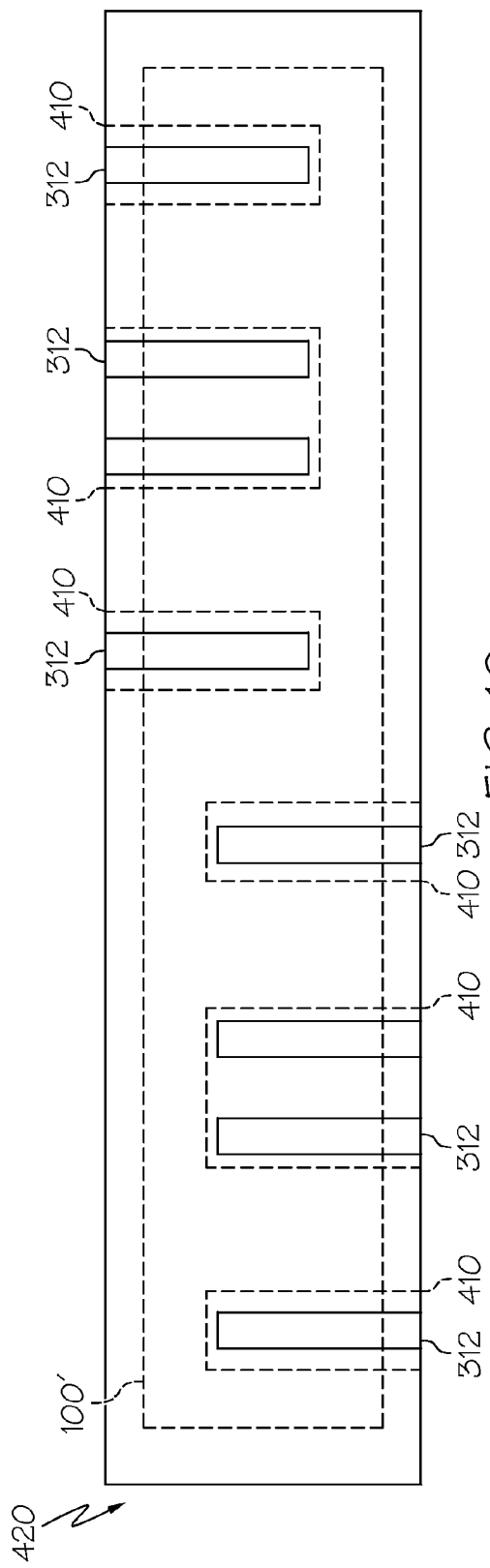
Figure 11:
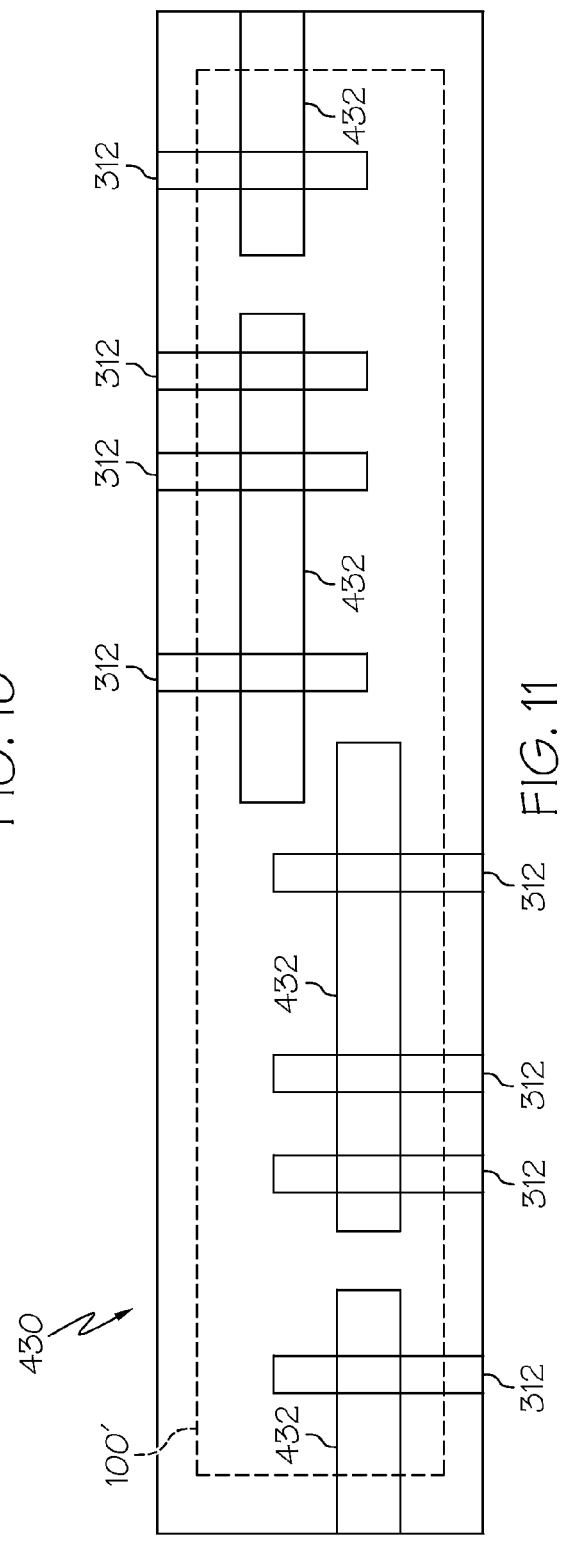

Referring now to FIG. 8, this example continues from the point of the semiconductor device structure of FIG. 6 having fins 354 formed on the substrate. FIG. 9 illustrates the cell boundary 100' of the future (to be formed) SRAM cell 100 (FIG. 1) together with areas 410 that are the areas where the FinFET devices will be formed along with power supply and other contact points. Continuing with this example, FIG. 10 depicts the semiconductor device structure 420 after removal of the unnecessary fins (commonly referred to as "dummy fins"). Although other fabrication steps or sub-processes may be performed after semiconductor device structure 420 has been formed or provided, this example continues by forming the gates 432. In exemplary embodiments, the gates 432 are formed using a unidirectional, jogless and iso-dimensional process, which results in the formation of the gates 432 a single direction and being all the same size. FIG. 11 depicts the semiconductor device structure (6T SRAM cell) 430 after formation of the gates 432.

Figure 12:
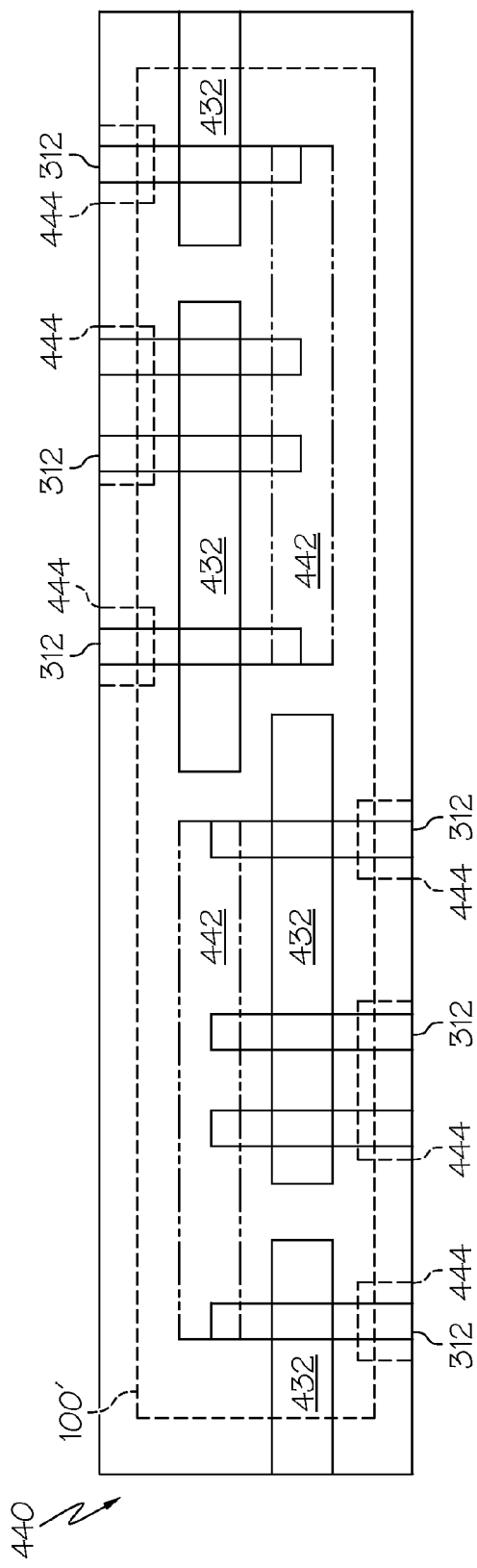

This example continues by forming a first contact layer having contacts 442 and 444 each formed by etching a trench or hole in an insulator down to the conducting layer below and then filling with a metal such as tungsten and then using a chemical mechanic polish (CMP) to planarize and complete the process. In exemplary embodiments, the contacts 442 and 444 are formed on a single layer, albeit using two masks. A first mask is used to form contacts 442 (which will become the shared contact) and a second mask is used to form contacts 444 (which will become power supply and bit line contacts). FIG. 12 depicts the semiconductor device structure 440 after formation of the contacts 442 and 444. Use of the two masks for the contacts 442 and 444 achieves closer proximity than using a single mask. That is, the proximity limitation is one of overlay rather than one of fundamental technology line pitch. In exemplary embodiments, the contacts 442 and 444 are formed using the unidirectional, jogless and iso-dimensional process and the contacts 442 self-align to the adjacent gates 432 since the gates are covered by an insulating etch stop material so no conducting path to the gate is created when metal is deposited into the contact trench or hole.

Figure 13:
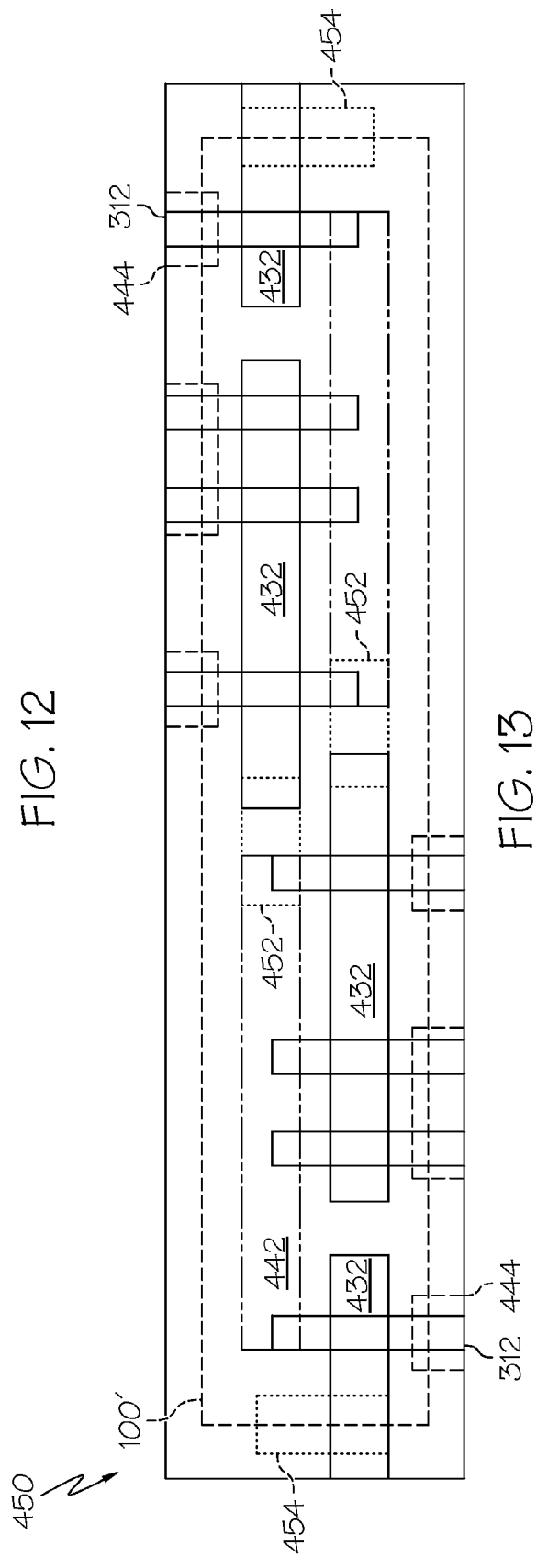

Continuing with this example, FIG. 13 depicts the semiconductor device structure 450 after formation of a second contact layer forming contacts 452 and 454. Although these contacts are lithographically patterned and etched separately from the contacts of 442 and 444 (FIG. 12), the metal fill and subsequent chemical mechanic polish (CMP) follow similar process steps. Also, contacts 452 and 454 are again formed using two masks for the contacts 452 and 454 achieve closer proximity than using a single mask. Also, the contacts 452 and 454 are formed using the unidirectional, jogless and iso-dimensional process. A first mask is used to form contacts 452 (which connects the gates to the shared contact) and a second mask is used to form contacts 454 (which will become a contact for the word line 144 (FIG. 1)).

This example continues by forming a third contact layer forming contacts 462 and 464. FIG. 14 depicts the semiconductor device structure 460 after formation of a second contact layer forming contacts 462 and 464. Similar to the prior contact layers (FIGS. 12-13), in exemplary embodiments, contacts 462 and 464 for formed using two masks for the contacts 462 and 464 achieves closer proximity than using a single mask. Also, the contacts 462 and 464 are formed using the unidirectional, jogless and iso-dimensional process. A first mask is used to form contacts 462 and a second mask is used to form contacts 464. These contacts will be used for power supply (120 and 121), the complementary bit lines (116 and 118) and the word line (114) of FIG. 1.

Continuing with this example, FIG. 15 depicts the semiconductor device structure 470 after formation of a metallization layer. The metallization layer is also formed using two masks for the layers 472 and 474 to achieve closer proximity than using a single mask. Also, the layer 472 and 474 are formed using the unidirectional, jogless and iso-dimensional process. A first mask is used to form layer 472 (which connects the gates to the shared contact) and a second mask is used to form layer 474. These layers lay across multiple SRAM cells (100 of FIG. 1) to bring power supply (121), ground (121), the complementary bit lines (116 and 118) and the word line (114) of FIG. 1 to an array of SRAM cells discussed below in conjunction with FIG. 18.

Figure 16:
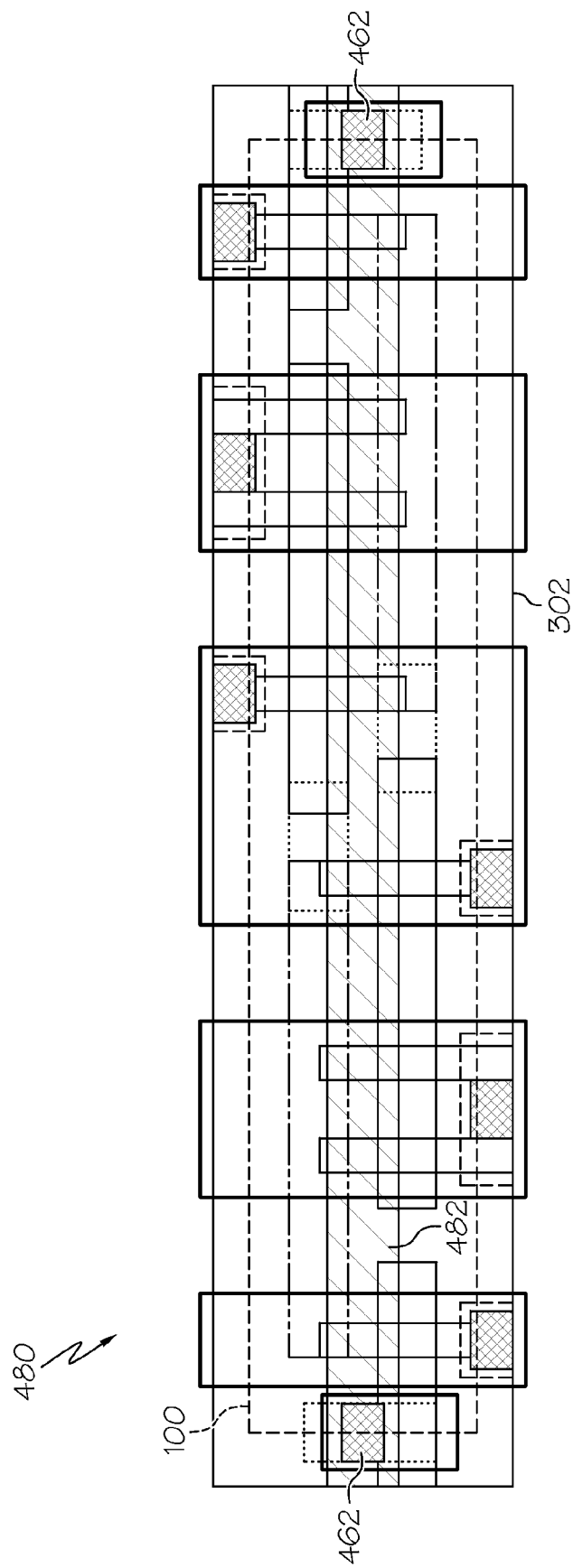

Finally, this example concludes with FIG. 16, where another metallization layer 482 is depicted for the semiconductor device structure 480. The metallization layer 482 connects the contacts 462 on either end of the SRAM cell for the word line (114 of FIG. 1) making the word line essentially one contact per SRAM cell as the metallization layer 482 traverses across multiple SRAM cells formed in a row as will be discussed more fully below.

Figure 17:
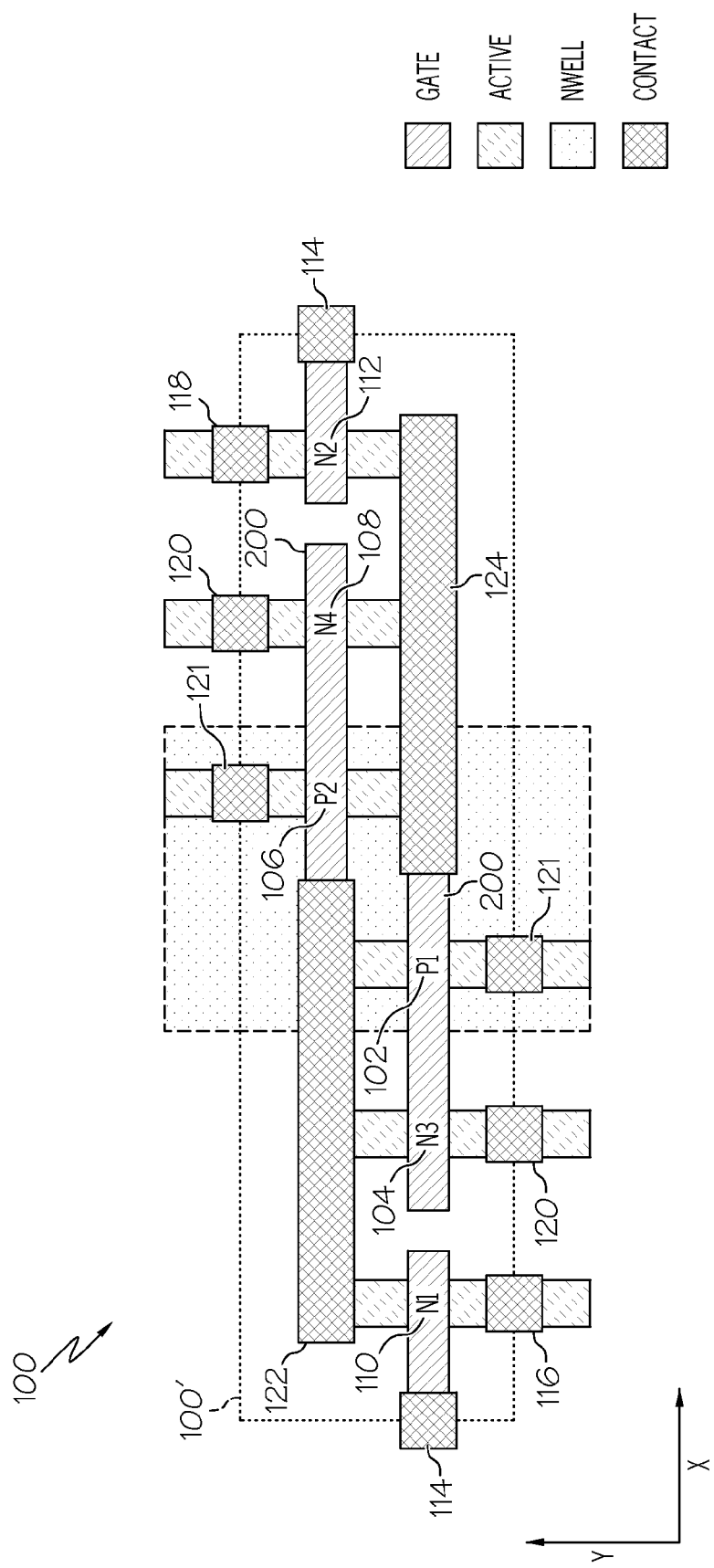
FIG. 17 is a layout view illustrating the topology of exemplary embodiments of the present disclosure for the SRAM cell of FIG. 1.

Referring now to FIG. 17, the SRAM cell 100 (FIG. 1) is illustrated in layout view depicting cell boundary 100' and the topology of exemplary embodiments of the present disclosure. For convenience of comparison to the conventional topology (see FIG. 2A and FIGS. 7A and 7B) like reference numerals are shown. As can be seen in FIG. 17, the unidirectional, jogless and iso-dimensional process used in exemplary embodiments prints all lines along a single axis (the x axis) without any orthogonal printing as in conventional layouts. Also, the gates 200 of the inverters are aligned with the shared contacts 122 and 124, which reduces the cell boundary 100' in the direction of the complementary bit lines 116 and 118 (see FIGS. 7A and 7B). This size reduction provides a reduced bit line capacitance, which offers a performance advantage to the topology of FIG. 17, as well as a layout that is readily employed in sub-22 nm geometries due to the unidirectional, jogless and iso-dimensional process. The passgates 110 and 112 also have a gate contact aligned with the common gate of the inverters and are positioned on the perimeter of the SRAM cell 100 adjacent to FinFET 104 and 108, respectively.

Figure 18:
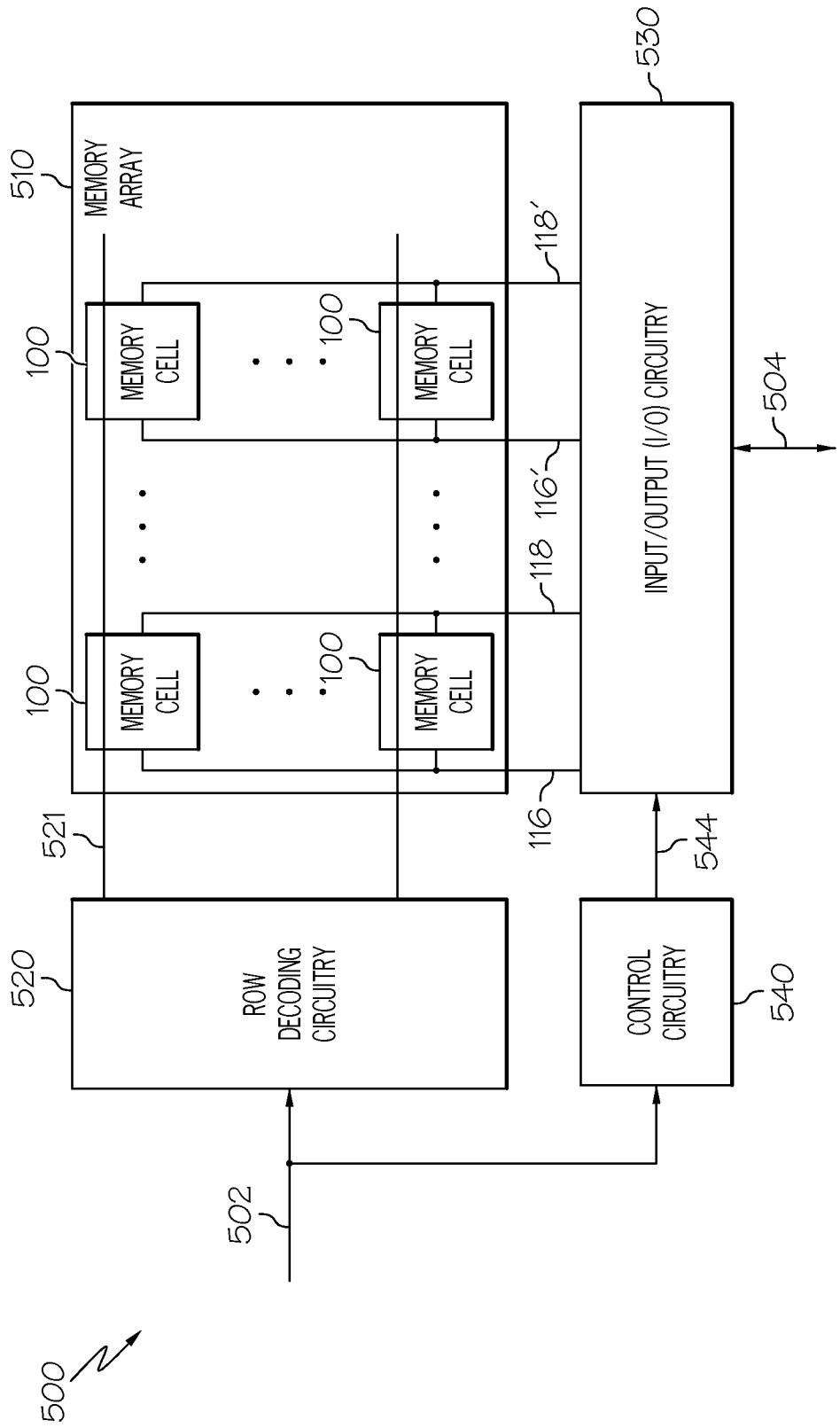
FIG. 18 is an illustration of the 6T SRAM cell of FIG. 1 arranged into an SRAM array according to exemplary embodiments of the present disclosure.

Referring now to FIG. 18, the SRAM cell 100 (FIG. 1) is illustrated formed into a memory device 500. In one embodiment, the memory device 500 includes a memory array 510, row decoding circuitry 520, input/output (I/O) circuitry 530, and control circuitry 540. The memory array 510 includes multiple rows and multiple columns of memory cells, any suitable one or more of which may be a memory cell such as SRAM cell 100 (FIG. 1). As illustrated, the row decoding circuitry 520 is coupled to receive at least a portion of an address on address lines 502 and to generate a signal on a word line, such as a word line 521 for example, to select memory cells in a row of memory array 510 in response to the received address portion. For comparison to FIG. 1, the word line 521 corresponds to WL 114 of FIG. 1. Row decoding circuitry 520 generates a high voltage signal on a word line to activate the passgates (110 and 112 of FIG. 2) of memory cells 100 in a row of memory array 510. A single pair of complementary bit lines (116 and 118) is common to multiple memory cells in one column of memory array 510 as shown. The I/O circuitry 530 generally includes one or more sense amplifiers. A sense amplifier senses the complementary signals on a select bit line pair of multiple bit line pairs (116/118 and 116'/118') corresponding to multiple columns of memory array 510 and outputs on one or more data lines 504 corresponding amplified complementary signals or an amplified signal representative of a binary value corresponding to the sensed complementary signals. The I/O circuitry 530 also includes one or more write drivers that receive a signal or complementary signals representative of a binary value on one or more data lines 504 to assert corresponding complementary signals on a select bit line pair (116/118 and 116'/118') of multiple bit line pairs corresponding to multiple columns of memory array 510. The control circuitry 540 also receives at least a portion of the address 502 and generates one or more signals on one or more column select lines 544 to select memory cells in one or more columns of memory array 510 in response to the received address portion. In this way, several (potentially hundreds of millions) SRAM cells 100 of the present disclosure can be arrayed to form an SRAM memory device 500 for use in computing or other applications. The unique aspect ratio of this cell design reduces the bit line (116 and 118) length and capacitance, resulting in a substantially improved read delay performance. This is because the read delay parameter (which is represented as CV/I) is reduced by the corresponding reduction in the C (capacitance) term.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the disclosure in any way. Rather, the foregoing detailed description will provide those skilled in the art with a convenient road map for implementing the exemplary embodiments. It should be understood that various changes can be made in the size, spacing and doping of elements without departing from the scope of the disclosure as set forth in the appended claims and the legal equivalents thereof.

What is claimed is:
1. A method, comprising:
forming a first inverter having a first p-channel FinFET and a first n-channel FinFET, the first p-channel FinFET and the first n-channel FinFET having a first shared contact forming a first cell node and a first common gate; and
forming a second inverter cross-coupled to the first inverter and having a second p-channel FinFET and a second n-channel FinFET, the second p-channel FinFET and the second n-channel FinFET having a second shared contact forming a second cell node and a second common gate aligned with the first shared contact of the first inverter.

2. The method of claim 1, further comprising:
forming a pair of FinFET passgates each having a gate contact aligned with one of the first and second common gate and each having a source or drain contact respectively coupled the first and second cell nodes.

3. The method of claim 2, further comprising:
forming complementary bit lines, each of the complementary bit lines respectively connected to the source or drain contact of one of the pair of FinFET passgates opposite that coupled to the first and second cell nodes.

4. The method of claim 3, further comprising:
forming a word line connected to a gate of each of the pair of FinFET passgates to provide a static random access memory cell.

5. The method of claim 4, further comprising forming a plurality of other static random access memory cells in a row each coupled to the word line.

6. The method of claim 5, further comprising forming a plurality of rows of static random access memory cells forming a plurality of columns of cells, each row having an individual word line and each column of the static random access memory cells coupled to an individual pair of complementary bit lines.

7. The method of claim 1, further comprising forming the first inverter and second inverter using a unidirectional, jogless and iso-dimensional semiconductor process.

8. The method of claim 1, further comprising forming the first inverter and second inverter via:
providing a substrate formed from a first semiconductor material;
forming a layer of etch stop material overlying the substrate;
forming a layer of second semiconductor material overlying the layer of etch stop material;
creating a fin pattern mask on the layer of second semiconductor material;
anisotropically etching the layer of second semiconductor material, using the fin pattern mask as an etch mask forming a fin formed from the second semiconductor material.

9. The method of claim 8, further comprising:
removing the fins from the substrate in areas other than the first and second p-channel FinFET and the first and second n-channel FinFET;
forming a gate contact for of the first and second p-channel FinFET and the first and second n-channel FinFET using a jogless, unidirectional, iso-dimensional process;
forming a first contact layer using the jogless, unidirectional, iso-dimensional process;
forming a second contact layer using the jogless, unidirectional, iso-dimensional process;
forming a third contact layer using the jogless, unidirectional, iso-dimensional process; and
forming a metallization layer using the jogless, unidirectional, iso-dimensional process.

10. A method, comprising:
forming a static random access memory cell having a FinFET latch and first and second FinFETs passgates via a jogless, unidirectional, iso-dimensional process, the FinFET latch formed of a first FinFET inverter having a first cell node coupled to the first FinFET passgate and having a second FinFET inverter having a second cell node coupled to the second FinFET passgate and a second common gate aligned via the jogless, unidirectional, iso-dimensional process to the cell node of the first FinFET inverter.

11. The method of claim 10, further comprising:
forming complementary bit lines, each of the complementary bit lines respectively connected to a source of one of the FinFET passgates.

12. The method of claim 11, further comprising: forming a word line connected to a gate of each of the pair of FinFET passgates.

13. The method of claim 12, further comprising forming a plurality of other static random access memory cells in a row each coupled to the word line.

14. The method of claim 13, further comprising forming a plurality of rows of static random access memory cells forming a plurality of columns of cells, each row having an individual word line and each of the plurality of columns of the static random access memory cells coupled to an individual pair of complementary bit lines.

15. The method of claim 10, further comprising:
forming the first inverter having a first p-channel FinFET and first n-channel FinFET, the first p-channel FinFET and the first n-channel FinFET and having a first shared contact forming a first cell node coupled to the first passgate and a first common gate; and
forming a second inverter having a second p-channel FinFET and second n-channel FINFET, the second p-channel FinFET and the second n-channel FinFET having a second shared contact forming a second cell node coupled to the second FinFET passgate and a second common gate.

16. The method of claim 15, further comprising forming the first inverter and second inverter via:
providing a substrate formed from a first semiconductor material;
forming a layer of etch stop material overlying the substrate;
forming a layer of second semiconductor material overlying the layer of etch stop material;
creating a fin pattern mask on the layer of second semiconductor material;
anisotropically etching the layer of second semiconductor material, using the fin pattern mask as an etch mask forming a fin formed from the second semiconductor material.

17. The method of claim 16, further comprising:
removing the fins from the substrate in areas other than the first and second p-channel FinFET and the first and second n-channel FinFET;
forming a gate contact for of the first and second p-channel FinFET and the first and second n-channel FinFET;
forming a first contact layer;
forming a second contact layer;
forming a third contact layer; and
forming a metallization layer.

* * * * *